(12) United States Patent
Leong et al.

(10) Patent No.: US 9,143,150 B1
(45) Date of Patent: Sep. 22, 2015

(54) DATA COMMUNICATIONS WITH ANALOG-TO-DIGITAL CONVERSION

(71) Applicant: NXP B.V., Eindhoven (NL)

(72) Inventors: Frank Leong, Veldhoven (NL); Andries Hekstra, Eindhoven (NL); Arie Koppelaar, Giessen (NL); Stefan Drude, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/467,947

(22) Filed: Aug. 25, 2014

(51) Int. Cl.
*H03M 1/00* (2006.01)
*H03M 1/12* (2006.01)
*H03M 1/36* (2006.01)

(52) U.S. Cl.
CPC .......... *H03M 1/1245* (2013.01); *H03M 1/1205* (2013.01); *H03M 1/00* (2013.01); *H03M 1/12* (2013.01); *H03M 1/365* (2013.01)

(58) Field of Classification Search
CPC .......... H03M 1/00; H03M 1/12; H03M 1/365
USPC ........................... 341/122, 123, 155, 158, 159
See application file for complete search history.

(56) References Cited

U.S. PATENT DOCUMENTS

| 7,015,842 B1 * | 3/2006 | Gupta et al. ................. 341/122 |
| 7,444,118 B2 | 10/2008 | Boh et al. | |
| 8,620,394 B2 | 12/2013 | Sebastiano et al. | |
| 2012/0105219 A1 | 5/2012 | Kofler | |
| 2013/0214732 A1 | 8/2013 | Nowottnick | |

OTHER PUBLICATIONS

AMS, AS3932 Datasheet—Applications "3D Low Frequency Wakeup Receiver", Revision 1.7, pp. 1-34, www.ams.com/LF-Receiver/AS3932.
M. van Elzakker et al., "A 10-bit Charge-Redistribution ADC Consuming 1.9 uW at 1 MS/s," IEEE JSSC, May 2010.
I.-Y. Lee et al., "A Fully Integrated TV Tuner Front-End with 3.1dB NF, >+31dBm OIP3, >83dB HRR3/5 and >68dB HRR7," IEEE ISSCC, 2014.
Harpe et al., "A 0.47-1.6 mW 5-bit 0.5-1 GS/s Time-Interleaved SAR ADC for Low-Power UWB Radios," IEEE JSSC, Jul. 2012.
J. van Sinderen et al., "Wideband UHF ISM-Band Transceiver Supporting Multichannel Reception and DSSS Modulation," IEEE ISSCC, 2013.

* cited by examiner

*Primary Examiner* — Joseph Lauture

(57) ABSTRACT

Aspects of the preset disclosure are directed to processing an analog signal transmitted during active portions of a duty cycle. As may be implemented in accordance with one or more embodiments, an apparatus includes a high-speed sampling circuit that samples portions of such an analog signal at a first rate corresponding to the active portion of the duty cycle, and stores the sampled portions of the analog signal. A low-speed analog-to-digital converter accesses the stored sampled portions and converts the sampled portions to a digital form at a second rate that is slower than the first rate.

20 Claims, 7 Drawing Sheets

DATA COMMUNICATIONS WITH ANALOG-TO-DIGITAL CONVERSION

Aspects of various embodiments are directed to data communications, with analog-to-digital conversion.

Signal communications often involve the communication of analog signals that are converted to digital form. This conversion often involves the use of an analog-to-digital converter (ADC). High-speed operation is often desirable, as is the communication of signals with a desirable signal-to-noise ratio (SNR).

In many radio receivers, Nyquist or $\Delta\Sigma$ ADCs are used to digitize downconverted signals. Circuits such as filters, tracking loops and demodulators are often implemented in the digital domain, which can provide flexibility and mitigate imperfections in analog implementations of these functions. In addition, these functions scale favorably with smaller process feature size.

Applications for such receivers include low-energy Bluetooth, television signal communications, radio frequency (RF) ranging, RADAR and other communications applications.

For many applications, operating an ADC for various applications can require high current consumption and/or a large chip area. As increases in performance are achieved, these aspects can become more difficult as they can scale nonlinearly relative to performance increases. For instance, RF ranging applications in which high timing resolution is desired may be difficult to implement without large current consumption and chip area overhead, which may undesirably limit sampling rates. These and other matters have presented challenges to data communication for a variety of applications.

Various example embodiments are directed to communication circuits and methods, and their implementation.

According to an example embodiment, a high-speed sampling circuit processes an analog signal transmitted in pulses during active portions of a duty cycle, by sampling portions of the analog signal at a first rate that corresponds to the pulses in an active portion of the duty cycle (and during the active portion of the duty cycle), and storing the sampled portions of the analog signal. A low-speed ADC converts the sampled portions of the analog signal to a digital form at a second rate that is slower than the first rate, by accessing the stored sampled portions of the analog signal during an inactive portion of the duty cycle and converting the accessed stored sampled portions of the signal to a digital form.

Another embodiment is directed to an apparatus including a filter, low-speed ADC, high-speed analog memory circuit; high-speed sampling circuit, and a switching circuit, which process an analog signal having pulses transmitted during active portions of a duty cycle. The filter broadens incoming pulses of the analog signal in time during an acquisition phase, and the low-speed ADC operates with the filter to provide synchronization by converting the broadened pulses. The high-speed sampling circuit processes the analog signal by sampling portions of the analog signal at a first rate corresponding to the active portion of the duty cycle, and storing the sampled portions in the high-speed analog memory circuit at the first rate. The switching circuit couples the analog signal to the filter during an acquisition phase in which the apparatus synchronizes with the analog signal, and after the acquisition phase has completed, decouples the filter from the incoming pulses and couples the analog signal to the high-speed sampling circuit. The low-speed ADC further operates with the high-speed analog memory circuit to access and convert the stored sampled portions of the signal to a digital form at a second rate that is slower than the first rate. In some implementations, the low-speed ADC converts the sampled portions of the analog signal to the digital form at a relatively slower rate during a period that includes an inactive portion of the duty cycle (or, during both active and inactive portions of the duty cycle), providing a high effective sampling rate and low power consumption relative to ADCs operating at a higher sampling rate.

In another embodiment, a method involves processing an analog signal transmitted during active portions of a duty cycle by sampling portions of the analog signal at a first rate corresponding to the active portion of the duty cycle, during an active portion of the duty cycle, and storing the sampled portions of the analog signal. The sampled portions of the analog signal are converted to a digital form at a second rate that is slower than the first rate, by accessing the stored sampled portions of the analog signal during an inactive portion of the duty cycle and converting the accessed stored sampled portions of the signal to a digital form.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
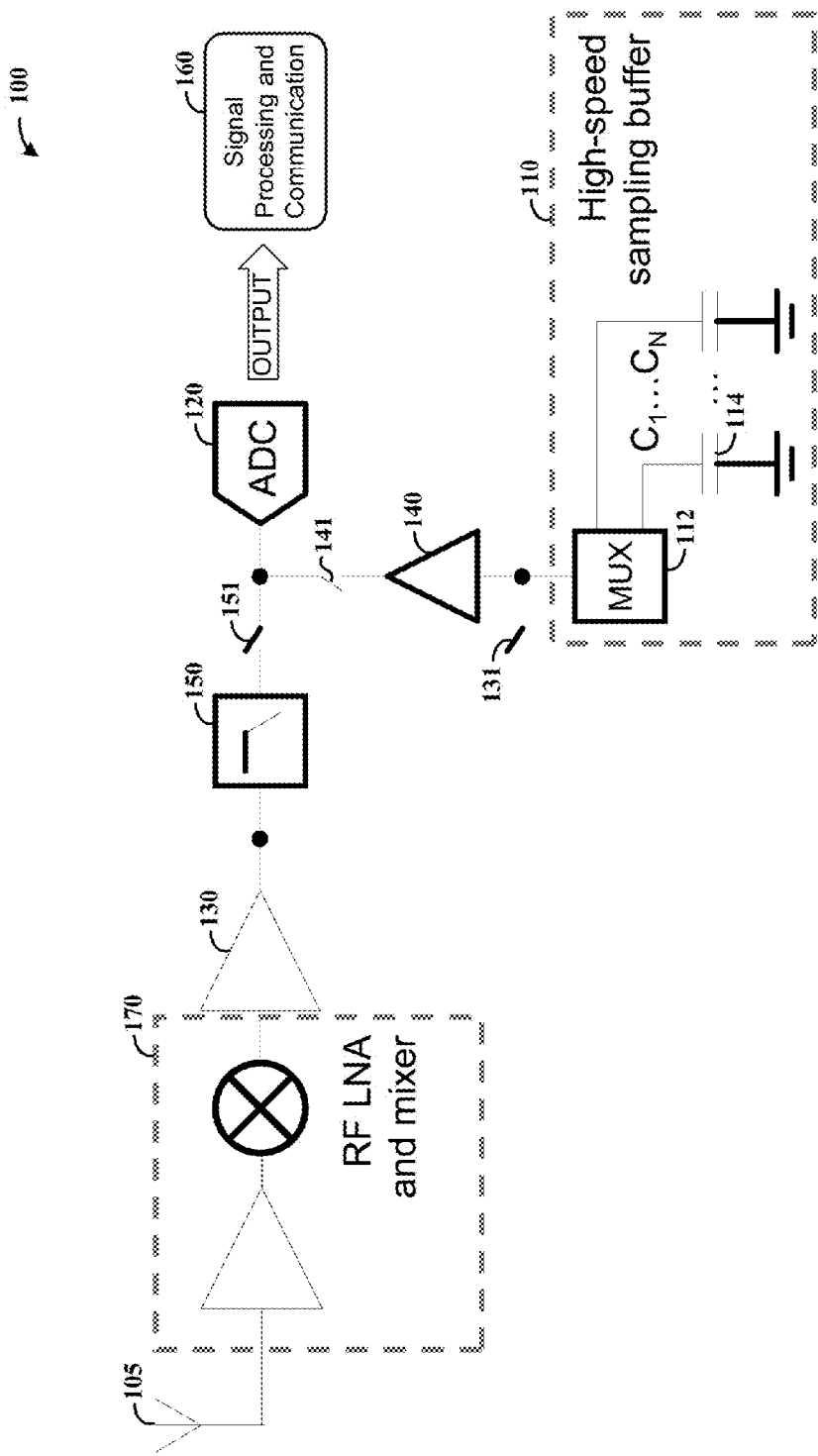
FIG. 1 shows a communication apparatus with a high-speed sampling buffer and an ADC, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving data communications with analog-to-digital conversion. While not necessarily so limited, various aspects may be appreciated through a discussion of examples using this context.

Various example embodiments are directed to implementation of high-speed sampling with a low-speed ADC, via operation of the ADC at an effective high sampling rate. Such an approach may be implemented, for example, with duty-cycled signals. In a particular implementation, incoming signal pulses are captured via a high-speed sampling buffer and provided to the ADC, which converts the pulses of the duty-cycled signal at a rate that is slower than the sampling rate, during a period that includes an inactive portion of the duty cycle (or, during both active and inactive portions). In some implementations, a high-speed analog memory (e.g., having capacitors) is used to store the incoming pulses as they are received, permitting the ADC to access the pulses over a time period that includes an inactive portion of the duty-cycled signal.

With these approaches, a low-speed ADC can be implemented at a high effective sampling rate, addressing challenges such as those described in the background above (e.g., relating to power consumption and circuit size). Accordingly, a high sampling rate can be achieved with relatively low power consumption and chip area. Further, low quantization noise and low fractional spur noise levels can be achieved.

In a more particular embodiment, a filter broadens incoming pulses (smearing them out over time) during a first part of synchronization, which helps to prevent the incoming signal from escaping a receiver's search space or sampling grid. The ADC can be used with the first part of synchronization to capture the incoming signal, which is used for an initial synchronization in a coarse acquisition phase. After this initial synchronization, the receiver enables a high-speed sampler path including the sampling buffer, which then samples the incoming pulses which are presented to the low-speed ADC via memory or other buffer as described above.

A variety of communication methods and systems are operated in accordance with embodiments herein. For instance, ranging systems and other communications that employ duty-cycled signals can be implemented using a low-speed ADC with an effective high sampling rate. For instance, RF transceivers for applications such as Bluetooth, WLAN (wireless local area network), FM radio, DAB (digital audio broadcast), TV, DVB (digital video broadcast), GSM (global system for mobile communications), EDGE (enhanced data rates for GSM evolution), WCDMA (wideband code division multiple access), UMTS (universal mobile telecommunications system), HSPA (high speed packet access), UWB (ultra wideband), ZigBee (IEEE 802.15), RFID (radio frequency identification) and automotive keys can be implemented with such an approach.

In accordance with another embodiment, an apparatus includes a high-speed sampling circuit that processes analog signals transmitted during active portions of a duty cycle, such as with duty-cycled signals that communicate pulses during active portions of the duty cycle. Portions of the analog signal are sampled at a first rate corresponding to an active portion of the duty cycle, during an active portion of the duty cycle, and the sampled portions of the analog signal are stored (e.g., in a buffer or high-speed memory). The apparatus also includes a low-speed ADC that converts the sampled portions of the analog signal to a digital form at a second rate that is slower than the first rate. This slower conversion is achieved by accessing the stored sampled portions of the analog signal during an inactive portion of the duty cycle and converting the accessed stored sampled portions of the signal to a digital form. In some implementations, the low-speed ADC converts the sampled portions of the analog signal to the digital form at a relatively slower rate during a period that includes an inactive portion of the duty cycle (or, during both active and inactive portions of the duty cycle). In further implementations, signal processing and communication circuitry process packet data provided in the analog signals and converted by the ADC, and communicate a response to a remote device from which the packet data is transmitted according to the duty cycle.

With these approaches, a relatively low-speed ADC can be implemented for heavily duty-cycled communications, making use of the inactive portion of the duty cycle to convert received signals while maintaining an effectively high sampling rate for the signal. Accordingly, issues such as those discussed above can be addressed.

In certain embodiments, the apparatus also includes a filter that broadens incoming pulses of the analog signal in time during an acquisition phase. A synchronization circuit operates with the ADC to synchronize operation of the apparatus to the duty cycle of the signal during the acquisition phase, by converting the broadened pulses in the ADC and synchronizing the converted broadened pulses. The synchronization circuit may, for example, be implemented as part of the ADC or in a processing circuit that receives the ADC output. In certain embodiments, the high-speed sampling circuit samples the portions of the analog signal at a repetition frequency at which the incoming pulses are received or at a multiple of such repetition frequency, based on the synchronization. Other embodiments further include a high-speed sampling switch that decouples the analog signal from the high-speed sampling circuit during the acquisition phase, and couples the analog signal to the high-speed sampling circuit after the acquisition phase has completed. In still other embodiments, a clock circuit generates a clock signal corresponding to a repetition frequency at which incoming pulses of the analog signal are received, based upon the synchronization, and the high-speed sampling circuit uses the clock signal to sample and store the portions of the analog signal at a rate corresponding to the repetition frequency.

The sampled signals may be stored in a variety of manners. In some embodiments, a memory circuit stores the sampled portions of the analog signal at the first rate, in synchronization with the high-speed sampling circuit. In other implementations, a buffer-type circuit is used.

A variety of duty-cycled signals may be processed in this regard. In some embodiments, analog signals are transmitted according to a duty cycle having an active portion during which a pulse of the analog signal is transmitted and an inactive portion during which pulses of the analog signal are not transmitted. The high-speed sampling circuit operates to sample the pulses during the active portion, store the sampled pulses as they are received, and provide the stored pulses to the low-speed ADC during the inactive portion of the duty cycle. The low-speed ADC operates during both the active and inactive portions of the duty cycle, utilizing the relatively large timeframe in which to convert the analog signal.

Other embodiments are directed to method in accordance with apparatuses or other embodiments herein, in which an analog signal is transmitted during active portions of a duty cycle and processed by sampling portions of the analog signal at a first rate corresponding to the active portion of the duty cycle, and converting the sampled portions of the analog signal to a digital form at a second rate that is slower than the first rate. For instance, a buffer or other memory can be used to store the incoming samples and an ADC can then convert the samples at a relatively slower rate during a period that includes an inactive portion of the duty cycle (or, during both active and inactive portions).

In some embodiments, incoming pulses of the analog signal are broadened in time during an acquisition phase to facilitate synchronization. The sampling is then synchronized to the duty cycle of the signal during the acquisition phase, by converting the broadened pulses from analog to digital form and synchronizing the converted broadened pulses. In certain implementations, the portions of the analog signal are sampled at a repetition frequency at which the incoming pulses are received, based on the synchronization. A switching function can be implemented for the acquisition phase, with the analog signal being decoupled from a high-speed sampling circuit that samples the analog signal, and coupled to an ADC that converts the broadened pulses. After the acquisition phase has completed, the analog signal is decoupled from the ADC and the analog signal is coupled to the high-speed sampling circuit. In further implementations, a clock signal corresponding to the repetition frequency of pulses of the analog signal is generated based upon the synchronization, and the signal processing implements the clock signal.

In certain embodiments, analog signals are transmitted according to a duty cycle having an active portion during which a pulse of the analog signal is transmitted and an inactive portion during which pulses of the analog signal are not transmitted. The sampling and storing steps above are carried out during the active portion of the duty cycle, the stored pulses are provided for low-speed analog-to-digital conversion during the inactive portion of the duty cycle, and the converting step is carried out during both the active and inactive portions of the duty cycle.

In further embodiments, the converted data is used to extract packets that are provided in the analog signals. A response to a remote device from which the packet data is transmitted is generated and transmitted according to the duty cycle. Such an approach may, for example, be implemented with one or more communication approaches, such as RF ranging and others as described herein.

Turning now to the figures, FIG. 1 shows a communication apparatus 100 for processing signals received via an antenna input 105, with a high-speed sampling buffer 110 and a low-speed analog-to-digital converter (ADC) 120, in accordance with another example embodiment. The apparatus 100 processes incoming signals at amplifier 130, which are sampled at high-speed sampling buffer 110, as coupled to receive the incoming signals via switch 131. In some implementations, the apparatus 100 also includes an RF low-noise amplifier (LNA) and mixer circuit 170. The sampled signals are buffered (e.g., temporarily stored) at the high-speed sampling buffer 110, provided to the low-speed ADC 120 via amplifier 140 and switch 141, and processed in the low-speed ADC 120 at a relatively low speed. Such an approach may, as consistent with the above discussion, be used for sampling a duty-cycled signal having a high repetition frequency (e.g., high speed). The sampling buffer 110 can be used in this regard to permit a lower-speed conversion in the low-speed ADC 120 that uses an inactive portion of the duty cycle (or, e.g., both active and inactive portions of the duty cycle). Accordingly, it has been recognized/discovered that analog-to-digital conversion can be carried out using a lower-speed ADC 120 and the high-speed sampling buffer 110, with power and/or space savings relative to higher-speed ADCs used for processing the incoming signals in real time.

In some embodiments, a filter 150 operates to facilitate capture of an initial pulse or pulses from the incoming signal by the low-speed ADC 120 without necessarily implementing the high-speed sampling buffer 110, by broadening the initial pulse or pulses. Switch 151 connects the filter 150 to low-speed ADC 120, and the low-speed ADC 120 synchronizes to the broadened pulses while operating at low speed, relative to the pulses received in the filter. After coarse synchronization in this regard, switch 151 may be opened with switches 131 and 141 operating as above to engage the high-speed sampling buffer 110.

In some embodiments, the apparatus 100 includes signal processing and communication circuitry 160, which may operate in various wireless communications standards and methods between respective devices, such as in RF ranging applications. Such circuitry may, for example, process the digital data converted via the ADC, and provide a response to a source from which the communication is received. One or both of the apparatus and the source operate(s) relative to the duty cycle, providing a low-power application.

By way of example, the high-speed sampling buffer is shown having a multiplexer 112 that multiplexes signals received and provided to the low-speed ADC 120, as well as a number "N" of capacitors $C_1$-$C_N$, with capacitor 114 labeled by way of example. Other embodiments implement different high-speed storage (memory) for storing the incoming signal pulses and providing the pulses to the low-speed ADC 120 via multiplexer 112.

Various ADC circuits can be used to suit particular embodiments, including those as characterized in connection with low-speed ADC 120 of FIG. 1. In some implementations, a CMOS ADC is implemented with a Nyquist converter. In certain embodiments, a charge redistribution ADC is used, such as described in M van Elzakker et al., "A 10-bit Charge-Redistribution ADC Consuming 1.9 uW at 1 MS/s," IEEE JSSC, May 2010, which is fully incorporated herein by reference.

A variety of sampling buffer amplifiers can be used in connection with various embodiments. For general information regarding such applications, and for specific information regarding sampling buffers that can be used in accordance with one or more embodiments, reference may be made to I.-Y. Lee et al., "A Fully Integrated TV Tuner Front-End with 3.1 dB NF, >+31 dBm OIP3, >83 dB HRR3/5 and >68 dB HRR7," IEEE ISSCC, 2014, which is fully incorporated herein by reference.

In various embodiments, the high-speed sampling buffer 110 and multiplexer 112 provide a sample rate that accommodates incoming signals while mitigating (e.g., limiting) or preventing charge injection or feed-through, nonlinear impedance, or droop/leakage. Capacitance at the buffer input can be reset (in charge) between replay operations of a particular sample, to prevent one sample from affecting the outcome of conversion of the next sample(s) and thereby avoid finite impulse response (FIR) low-pass filtering characteristics. Circuit blocks settle quickly after being enabled, such that a long lead time for turn-on can be avoided.

Current consumption and silicon area for the filter 150 are limited using one or more of the following, as may be implemented in one or more embodiments. The filter 150 can be turned off once the high-speed sampler is activated. The switches 131, 141 and 151 can be made as small as feasible for a target bandwidth and noise performance. A clock tree implemented for the multiplexer 112 and the reset switches in the high-speed sampling buffer 110 can also be implemented in as compact a manner as possible, while still having predictable behavior on enable and disable operations.

Figure 2:
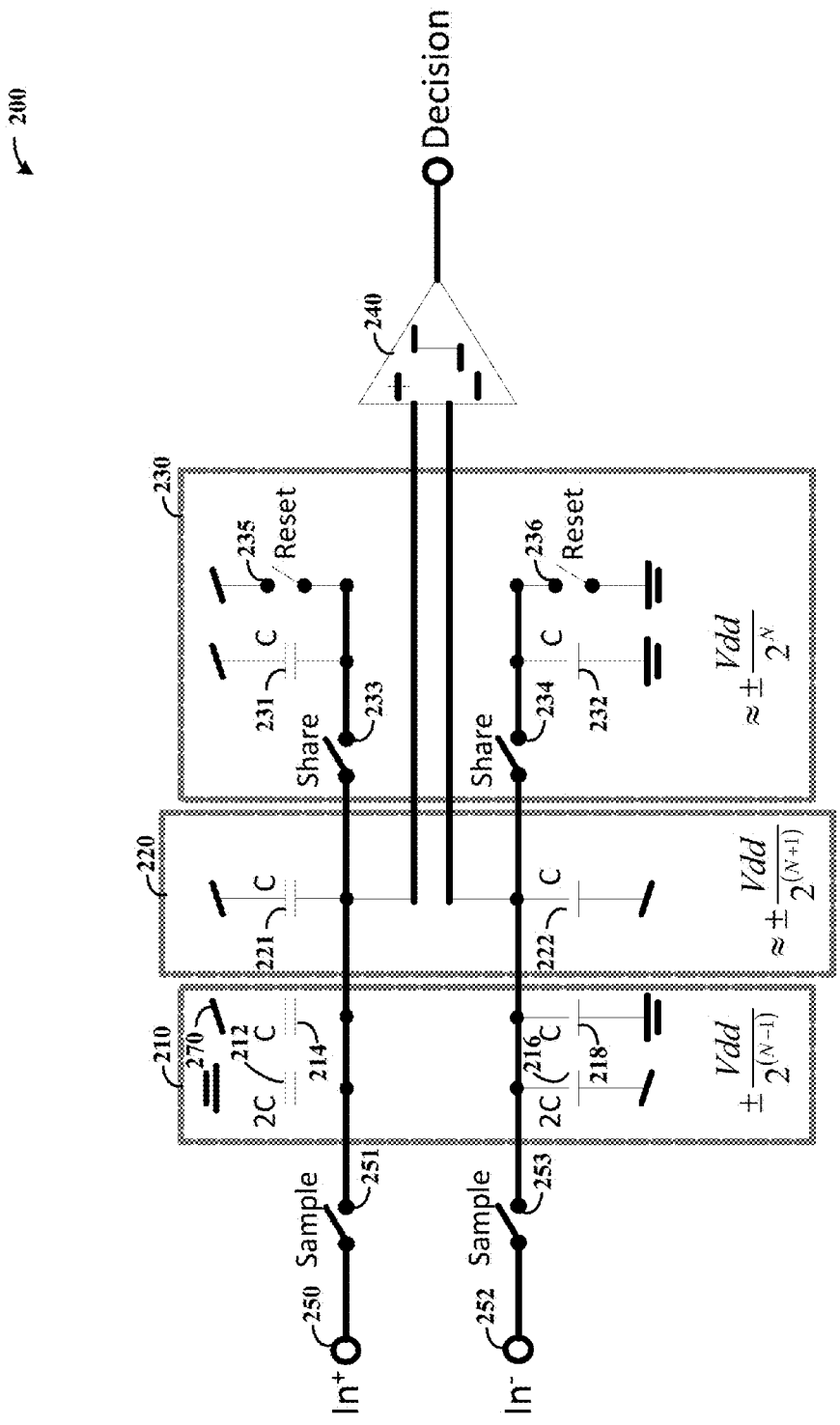
FIG. 2 shows an ADC in accordance with another example embodiment.
Figure 7:
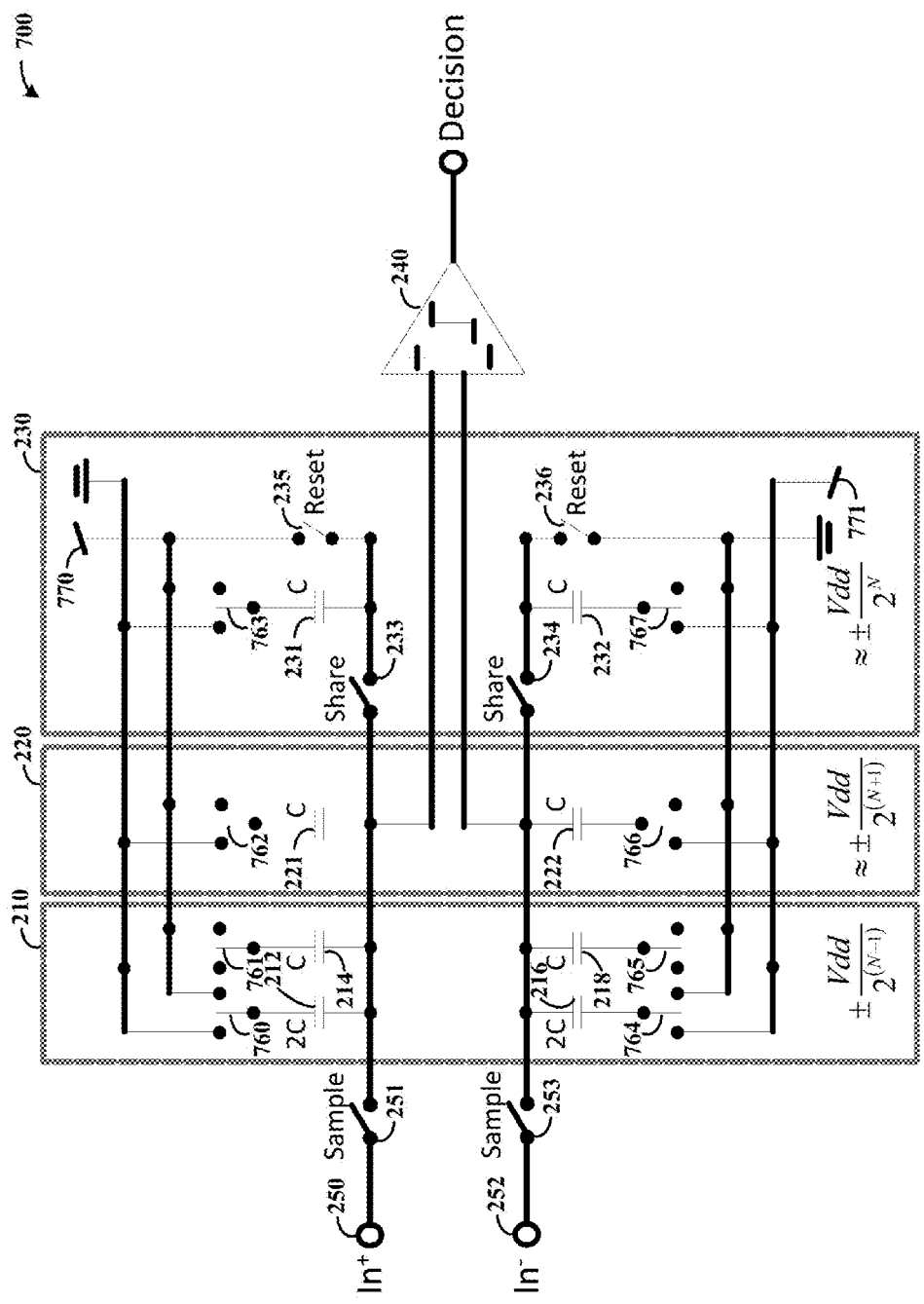
FIG. 7 shows another ADC apparatus with switches in a neutral position, in accordance with another example embodiment.

FIG. 2 shows an ADC apparatus 200, in accordance with another example embodiment as may be implemented for an initial operational state. The ADC apparatus 200 includes three stages 210, 220 and 230 as shown, which feed a comparator 240 based on an incoming signal presented at inputs 250 and 252 that are coupled to the first and second stages (210 and 220 respectively) via sample switches 251 and 253, and to the third stage via share switches 233 and 234. The first stage 210 includes capacitors 212 and 214 on the upper side, and capacitors 216 and 218 on the lower side. The second stage 220 includes capacitor 221 on the upper side, and capacitor 222 on the lower side. The third stage 230 includes capacitor 231 and reset switch 235 on the upper side, and capacitor 232 and reset switch 236 on the lower side. The switches are shown in a starting state for the ADC apparatus 200, and are operated for processing a signal for the ADC apparatus 200. The connectivity of each capacitor to reference/ground or an operating voltage can be flipped/switched, such as by using switches as shown in FIG. 7 and discussed below. In some implementations, one or more of the capacitors is coupled via an additional switch. Additional capacitors may be implemented for embodiments involving increased resolution.

The ADC apparatus 200 may be implemented in a variety of manners. In some embodiments, conversion is carried out by toggling the node voltage at the ends of the capacitors that do not carry the sampled input signal (e.g., as shown in FIG. 7 with node 770 and adjacent reference/ground). The incoming signal is first sampled and then compared using switches 251 and 253. If the signal on input 250 is lower, capacitors 214 and 218 are flipped, providing:

$Vin=Vin,old+Vdd/2.$

If the signal on input 250 is higher, capacitors 212, 214, 216 and 218 are flipped, providing:

$Vin=Vin,old-Vdd/2.$

Next, another comparison is carried out and, if the signal on input 250 is lower, the share switches 233 and 234 are closed, providing:

$Vin=4Vin,old/5+Vdd/2.5.$

If the signal on input 250 is higher, the share switches 233 and 234 are closed and capacitors 231 and 232 are flipped, providing:

$Vin=4Vin,old/5.$

Next, another comparison is carried out. If the signal at input 250 is lower, capacitor 222 on the lower side (e.g., a dummy capacitor) is flipped, providing:

$Vin=Vin,old+Vdd/5.$

If the signal at input 250 is higher, capacitor 221 on the upper side (e.g., also a dummy capacitor) is flipped, providing:

$Vin=Vin,old-Vdd/5.$

In certain implementations, capacitors 221 and 222 are tied to a positive voltage rail (e.g., as with 270 as well), and in other implementations the capacitors are tied to a negative voltage rail (or reference) with interchanged control signal routing. Another comparison is then performed and an output of the comparison is provided. With this approach, dynamic range and, correspondingly, effective number of bits (ENOB) can be maximized at high conversion speed with a relatively low number of capacitors.

In some implementations, non-linearity, due to the "share" switches 233 and 234, is accommodated for, such as may result when closing the share switches results in a non-binary redistribution of sampled charge. The final conversion step may be performed at a slightly different common-mode level, due to single-ended capacitor flipping. For high dynamic range (i.e., large number of capacitors and many bits at the converter output) the shift in common-mode at the final conversion step may be small. For instance, an 8-bit converter resolution or higher may be implemented, such that the shift in common-mode level does not significantly affect comparator performance.

In some embodiments, additional receiver front-end (RFE) components can be implemented in a manner similar to that described in J. van Sinderen et al., "Wideband UHF ISM-Band Transceiver Supporting Multichannel Reception and DSSS Modulation," IEEE ISSCC, 2013, which is fully incorporated herein by reference. For instance, current may be sampled, relative to voltage as noted therein.

Figure 3:
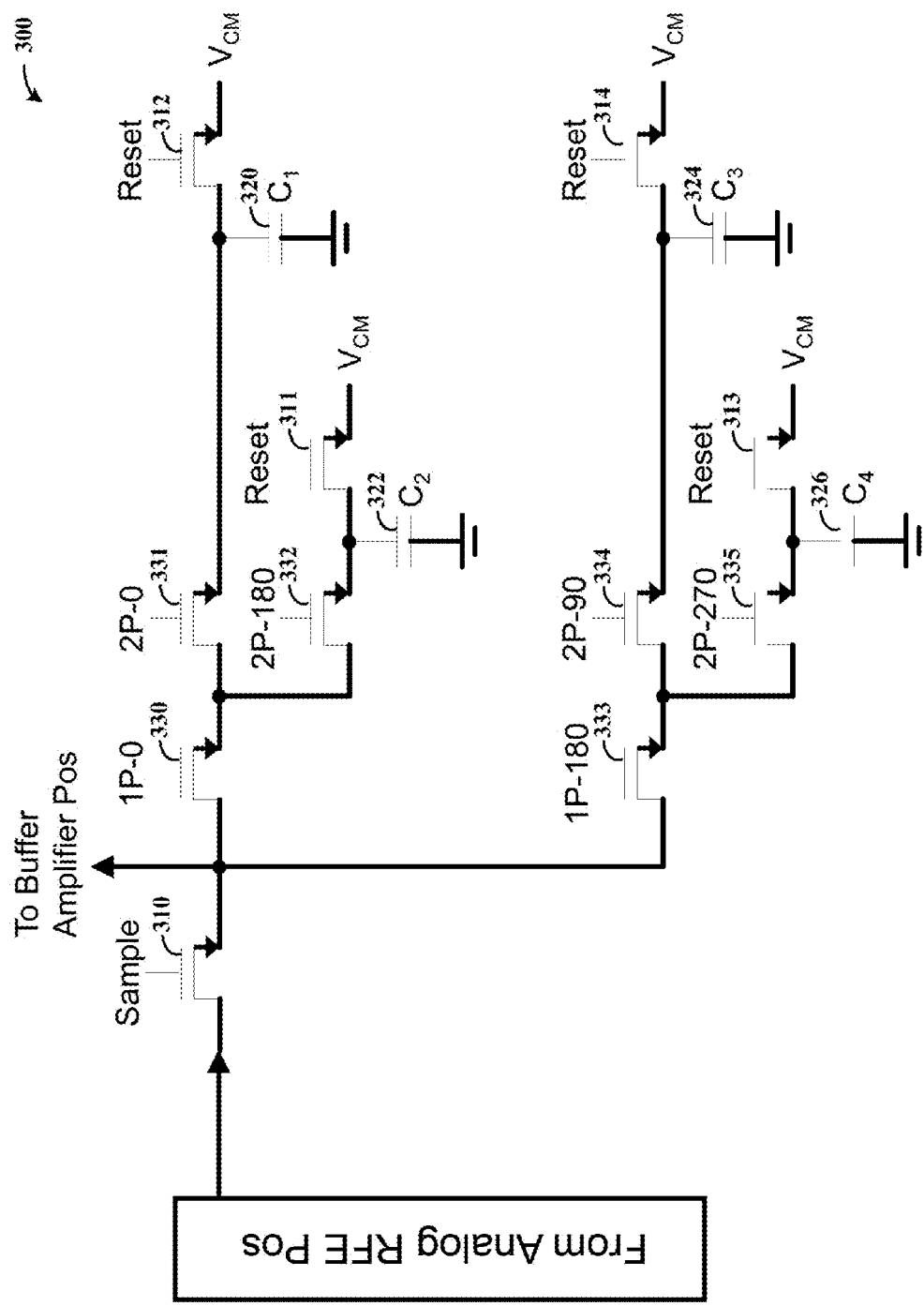
FIG. 3 shows a high-speed sampling buffer apparatus, in accordance with another example embodiment.

FIG. 3 shows a high-speed sampling buffer apparatus 300, in accordance with another example embodiment. The apparatus 300 is shown by way of example as a single-ended implementation (positive path), with inputs from a positive node on a RFE and output at a buffer amplifier positive node. An input sample switch 310 initiates sampling, and reset switches 311-314 mitigate inter-symbol interference. Capacitors 320, 322, 324 and 326 (C1-C4) are respectively connected via operation of switches 330-335. In various implementations, the depth of the tree is larger, and the replay phase is longer, to provide multiplication of the ADC's effective sampling rate (e.g., multiplication of an improvement factor in effective ADC sampling rate).

In a differential implementation, two such samplers are implemented, with one sampler connected to the positive RFE output and positive buffer amplifier input, and the other sampler being connected to the negative RFE output and negative buffer amplifier input. The control signals, as shown and described below in FIG. 4 and as may be implemented with FIG. 3, can be the same for both samplers. In some implementations, the capacitors for such a differential application are changed to a differential type, without grounded bottom plates.

Figure 4:
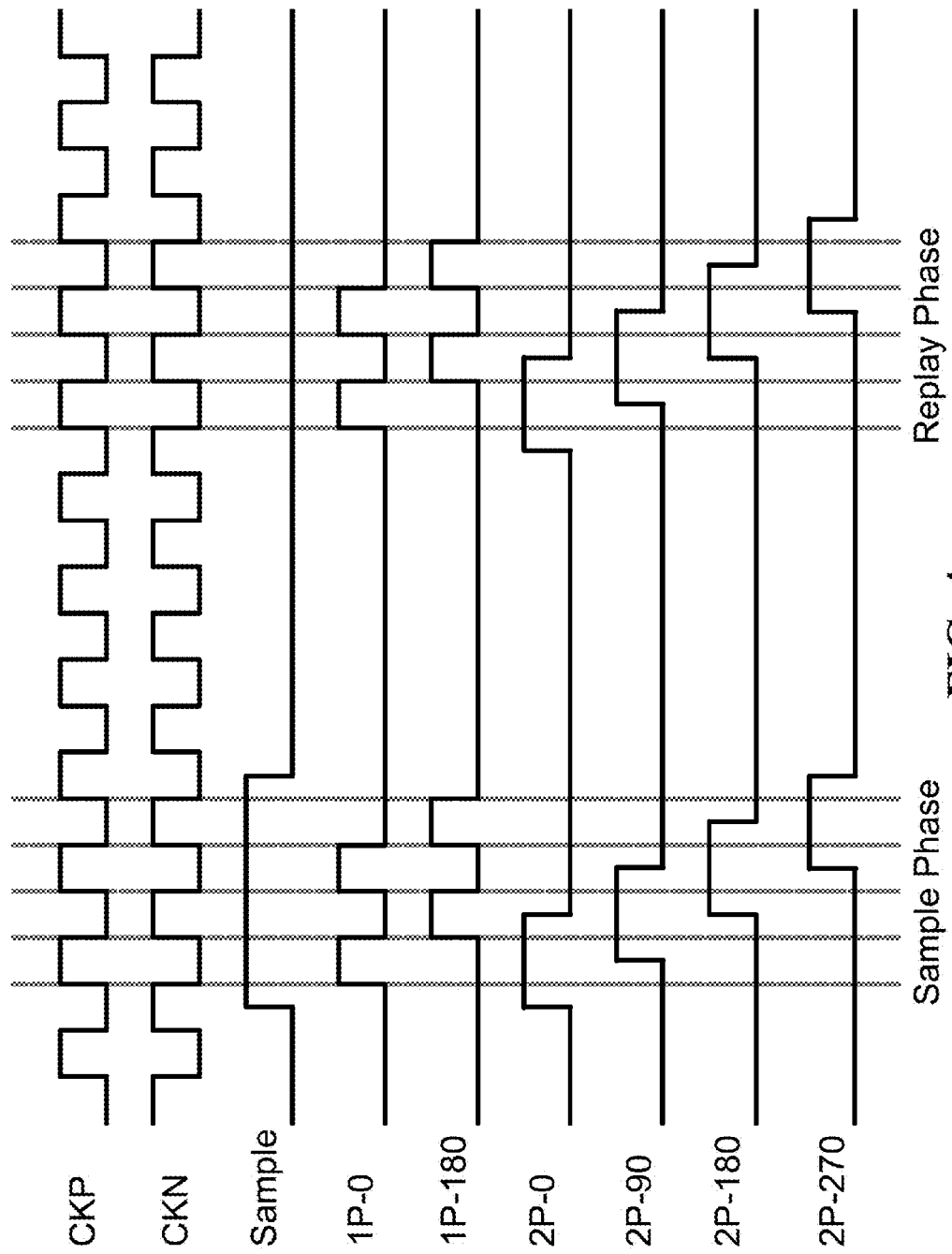
FIG. 4 shows a timing diagram, as may be implemented in accordance with one or more embodiments.
Figure 5:
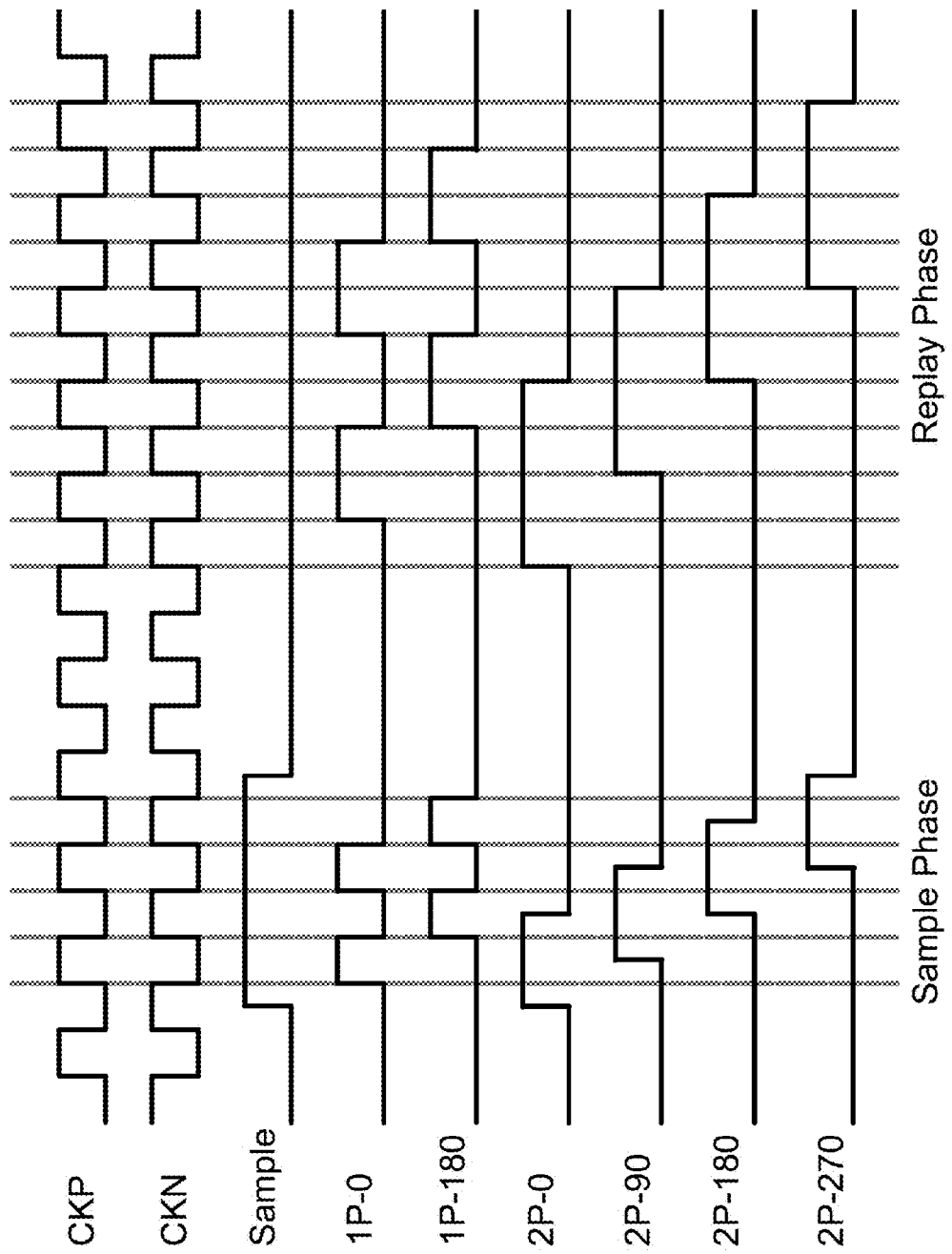
FIG. 5 shows another timing diagram, as may be implemented in accordance with one or more embodiments.

FIG. 4 shows a timing diagram, as may be implemented in accordance with one or more embodiments for both sample and replay phases for an ADC. In various embodiments, the timing diagram shown in FIG. 4 is used in the operation of the apparatus 300 of FIG. 3. The sample signal may be used to operate the sample switch 310, with positive/negative input signals shown as CKP and CKN. Each of the switches as shown in FIG. 3 are labeled with similar notation, as corresponding to the phase of the sampled signal at 0, 90, 180 or 270 at which the switch is operative. FIG. 5 shows another timing diagram, similar to FIG. 4 and implemented with slower playback of recorded signals for processing within an ADC.

Figure 6:
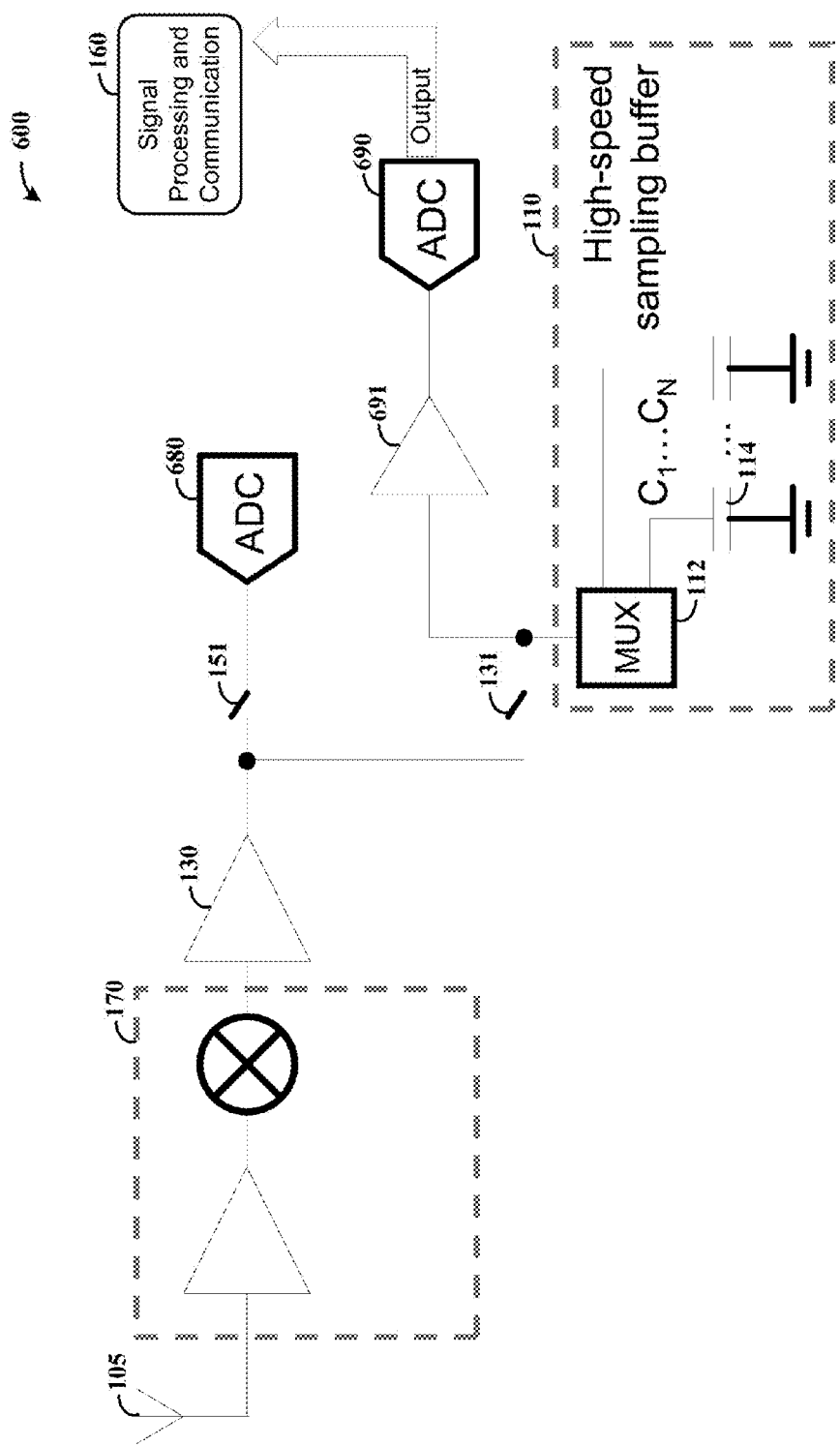
FIG. 6 shows another communication apparatus, with a high-speed sampling buffer and respective ADCs, in accordance with another example embodiment.

FIG. 6 shows another communication apparatus 600 for communicating in a manner similar to that shown in and described in connection with FIG. 1, with common components labeled consistently (and additional discussion thereof omitted here for brevity). Connectivity between amplifier 130 and the high-speed sampling buffer 110 is made via switch 131. A high-speed, low ENOB ADC 680 operates for capturing initial pulses before synchronization, as coupled via switch 151. A low-speed, high ENOB ADC 690 is connected to the high-speed sampling buffer 110 via amplifier 691. The apparatus 600 processes incoming signals, for example, by using high-speed low ENOB ADC 680 for initial signal acquisition and low-speed high ENOB ADC 690 for subsequent operation in converting incoming signals stored in the high-speed sampling buffer 110. In connection with this embodiment, it has been recognized/discovered that analog-to-digital conversion can be carried out using both ADCs 680 and 690, with lower power and space overhead than an ADC operating at high speed with high ENOB (e.g., without the high-speed sampling buffer 110).

FIG. 7 shows an ADC apparatus 700, in accordance with another example embodiment. The apparatus 700 may be implemented in accordance with the approach and circuitry in FIG. 2, with common components labeled consistently and further discussion thereof omitted here for brevity. Switches 760-767 connect each of the capacitors as shown to nodes 770 (upper) and 771 (lower), or to a reference/ground node.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., high-speed sampling buffer, or filter). For example, in certain of the above-discussed embodiments, one or more modules are discrete logic circuits or programmable logic circuits configured and arranged for implementing these operations/activities, as in the circuit modules shown in FIG. 1 (e.g., in accordance with a timing diagram as in FIG. 4). In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, additional capacitors may be used for ADC sampling. In addition, current-based sampling approaches can be used in place of or in connection with voltage-based approaches. Further, the various embodiments described herein may be combined in certain embodiments, and various aspects of individual embodiments may be implemented as separate embodiments. Such modifications do not depart from the true spirit and scope of various aspects of the invention, including aspects set forth in the claims.

What is claimed is:

1. An apparatus comprising:
   a high-speed sampling circuit configured and arranged to process an analog signal transmitted during active portions of a duty cycle, by:
      sampling portions of the analog signal at a first rate that corresponds to an active portion of the duty cycle, during an active portion of the duty cycle, and storing the sampled portions of the analog signal; and
   a low-speed analog-to-digital converter configured and arranged to convert the sampled portions of the analog signal to a digital form at a second rate that is slower than the first rate, by accessing the stored sampled portions of the analog signal during an inactive portion of the duty cycle and converting the accessed stored sampled portions of the signal to a digital form.

2. The apparatus of claim 1, further including a memory circuit configured and arranged to store the sampled portions of the analog signal at the first rate, in synchronization with the high-speed sampling circuit.

3. The apparatus of claim 1, further including:
   a filter configured and arranged to broaden incoming pulses of the analog signal in time during an acquisition phase; and
   a synchronization circuit configured and arranged with the analog-to-digital converter to synchronize operation of the apparatus to the duty cycle of the signal during the acquisition phase, by converting the broadened pulses in the analog-to-digital converter and synchronizing the converted broadened pulses.

4. The apparatus of claim 3, wherein the high-speed sampling circuit is configured and arranged to, after the acquisition phase, sample the portions of the analog signal at a repetition frequency at which the incoming pulses are received, based on the synchronization.

5. The apparatus of claim 4, further including a high-speed sampling switch configured and arranged to decouple the analog signal from the high-speed sampling circuit during the acquisition phase, and to couple the analog signal to the high-speed sampling circuit after the acquisition phase has completed.

6. The apparatus of claim 3,
   further including a clock circuit configured and arranged to generate a clock signal corresponding to a repetition frequency at which incoming pulses of the signal are received, based upon the synchronization, and
   wherein the high-speed sampling circuit is configured and arranged to use the clock signal to sample and store the portions of the analog signal at a rate corresponding to the repetition frequency.

7. The apparatus of claim 1, wherein the low-speed analog-to-digital converter is configured and arranged to convert the sampled portions of the analog signal to the digital form in both active and inactive portions of the duty cycle.

8. The apparatus of claim 1, wherein, for analog signals transmitted according to a duty cycle having an active portion during which a pulse of the analog signal is transmitted and an inactive portion during which pulses of the analog signal are not transmitted:
   the high-speed sampling circuit is configured and arranged to sample the pulses during the active portion, store the sampled pulses as they are received, and provide the stored pulses to the low-speed analog-to-digital converter during the inactive portion of the duty cycle, and
   the low-speed analog-to-digital converter is configured and arranged to operate during both the active and inactive portions of the duty cycle.

9. The apparatus of claim 1, further including signal processing and communication circuitry configured and arranged to process packet data provided in the analog signals and converted by the analog-to-digital converter, and communicate a response to a remote device from which the packet data is transmitted according to the duty cycle.

10. An apparatus comprising:
   a filter configured and arranged to broaden incoming pulses of an analog signal in time during an acquisition phase, the analog signal having pulses transmitted during active portions of a duty cycle;
   a low-speed analog-to-digital converter configured and arranged with the filter to provide synchronization by converting the broadened pulses;
   a high-speed analog memory circuit;
   a high-speed sampling circuit configured and arranged to process the analog signal by sampling portions of the analog signal at a first rate corresponding to the active portion of the duty cycle, and storing the sampled portions in the high-speed analog memory circuit at the first rate;
   a switching circuit configured and arranged to couple the analog signal to the filter during an acquisition phase in which the apparatus synchronizes with the analog signal, and after the acquisition phase has completed, decouple the filter from the incoming pulses and couple the analog signal to the high-speed sampling circuit; and the low-speed analog-to-digital converter being configured and arranged with the high-speed analog memory circuit to access and convert the stored sampled portions of the signal to a digital form at a second rate that is slower than the first rate.

11. The apparatus of claim 10, wherein the low-speed analog-to-digital converter is configured and arranged to convert the sampled portions of the analog signal to the digital form in both active and inactive portions of the duty cycle, providing a high effective sampling rate and low power consumption relative to analog-to-digital converters operating at a higher sampling rate.

12. A method comprising:
processing an analog signal transmitted during active portions of a duty cycle, by:
sampling portions of the analog signal at a first rate corresponding to the active portion of the duty cycle, during an active portion of the duty cycle, and
storing the sampled portions of the analog signal; and
converting the sampled portions of the analog signal to a digital form at a second rate that is slower than the first rate, by accessing the stored sampled portions of the analog signal during an inactive portion of the duty cycle and converting the accessed stored sampled portions of the signal to a digital form.

13. The method of claim 12, further including storing the sampled portions of the analog signal at the first rate.

14. The method of claim 12, further including:
broadening incoming pulses of the analog signal in time during an acquisition phase; and
synchronizing the sampling to the duty cycle of the signal during the acquisition phase, by converting the broadened pulses from analog to digital form and synchronizing the converted broadened pulses.

15. The method of claim 14, further including, after the acquisition phase, sampling the portions of the analog signal at a repetition frequency at which the incoming pulses are received, based on the synchronization.

16. The method of claim 14, further including:
during the acquisition phase, decoupling the analog signal from a high-speed sampling circuit in which the portions of the analog signal are sampled and stored, and coupling the analog signal to an analog-to-digital converter that converts the broadened pulses, and
after the acquisition phase has completed, decoupling the analog signal from the analog-to-digital converter and coupling the analog signal to the high-speed sampling circuit.

17. The method of claim 14,
further including generating a clock signal corresponding to the repetition frequency of pulses of the analog signal, based upon the synchronization, and
wherein the step of processing includes processing based on the clock signal.

18. The method of claim 12, converting the sampled portions of the analog signal to the digital form includes converting the sampled portions in both active and inactive portions of the duty cycle.

19. The method of claim 12, wherein, for analog signals transmitted according to a duty cycle having an active portion during which a pulse of the analog signal is transmitted, and an inactive portion during which pulses of the analog signal are not transmitted:
the steps of sampling and storing are carried out during the active portion of the duty cycle,
the stored pulses are provided for low-speed analog-to-digital conversion during the inactive portion of the duty cycle, and
the step of converting is carried out during both the active and inactive portions of the duty cycle.

20. The method of claim 12, further including processing packet data that is provided in the analog signals and converted, and communicating a response to a remote device from which the packet data is transmitted according to the duty cycle.

* * * * *